(12) United States Patent
Kim

(10) Patent No.: US 7,514,976 B2
(45) Date of Patent: Apr. 7, 2009

(54) PULSED FLIP-FLOP AND METHOD OF CONTROLLING THE SAME

(75) Inventor: Kwang-Il Kim, Gyeonggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 50 days.

(21) Appl. No.: 11/678,238

(22) Filed: Feb. 23, 2007

(65) Prior Publication Data

US 2007/0200606 A1 Aug. 30, 2007

(30) Foreign Application Priority Data

Feb. 23, 2006 (KR) ...................... 10-2006-0017720

(51) Int. Cl.
*H03K 3/356* (2006.01)

(52) U.S. Cl. .................... 327/218; 327/291; 327/299

(58) Field of Classification Search ................... 327/218
See application file for complete search history.

(56) References Cited

U.S. PATENT DOCUMENTS

| 5,617,049 A | 4/1997 | Hirano et al. |
| 6,853,227 B2 * | 2/2005 | Laletin ....................... 327/175 |

FOREIGN PATENT DOCUMENTS

| JP | 10-022789 | 1/1998 |
| JP | 10-162592 | 6/1998 |
| JP | 2003-188692 | 7/2003 |
| KR | 1020030002082 | 1/2003 |

* cited by examiner

*Primary Examiner*—Tuan T Lam
*Assistant Examiner*—Daniel Rojas
(74) *Attorney, Agent, or Firm*—F. Chau & Assoc., LLC

(57) ABSTRACT

A pulsed flip-flop capable of adjusting a pulse width according to an operating voltage includes: a flip-flop operating in synchronization with a pulse signal; a pulse generating circuit generating the pulse signal in response to a clock signal; and a pulse width control circuit reducing a width of the pulse signal generated by the pulse generating circuit when the operating voltage is lower than a reference voltage.

13 Claims, 3 Drawing Sheets

PULSED FLIP-FLOP AND METHOD OF CONTROLLING THE SAME

CROSS-REFERENCE TO RELATED APPLICATION

This U.S. non-provisional patent application claims priority under 35 U.S.C. § 119 of Korean Patent Application No. 2006-17720, filed on Feb. 23, 2006, the entire contents of which are hereby incorporated by reference.

BACKGROUND OF THE INVENTION

The present disclosure relates to a pulsed flip-flop and, more particularly to a pulsed flip-flop adjusting a pulse width.

A flip-flop includes a master-slave flip-flop and a pulsed flip-flop. The master-slave flip-flop connects two flip-flops in series. The master flip-flop receives data synchronized with a rising edge of a clock, and a slave flip-flop outputs data synchronized with a falling edge of a clock. When an input data value changes after a clock is shifted from low to high, the master flip-flop cannot store the input data value. Thus, it takes more time for setup of the input data.

On the other hand, a pulsed flip-flop receives a clock, generates an internal clock, and then outputs an inputted data during an interval corresponding to an internal pulse width. Accordingly, when data is inputted after a clock is shifted from low to high, the pulsed flip-flop can store and output the data. That is, since the pulse flip-flop has a short setup time for a clock of the input data, it is appropriate for use in a semiconductor device that requires high-speed operations. The pulsed flip-flop has disadvantages, however, related to a hold time. For example, the input data change during a interval corresponding to a pulse width of an internal pulse. That is, when an input data value changes during an interval corresponding to a pulse width of an internal pulse, an output value changes because the data value that is inputted later is stored and outputted.

Additionally, in the pulsed flip-flop, hold time characteristics deteriorate in a low-voltage operation. As described above, the pulse flip-flop needs to maintain data longer than a pulse width of an internal pulse, and delay rates of an internal pulse and an input data are different in a low-voltage operation. Therefore, hold time characteristics deteriorate. That is, since the pulse width of an internal pulse becomes longer than the input data delay, hold time error can occur.

SUMMARY OF THE INVENTION

Exemplary embodiments of the present invention provide a pulsed flip-flop having excellent hold time characteristics in a low-voltage operation.

Exemplary embodiments of the present invention provide a pulsed flip-flop including: a flip-flop operating in synchronization with a pulse signal; a pulse generating circuit generating the pulse signal in response to a clock signal; and a pulse width control circuit reducing a width of the pulse signal generated by the pulse generating circuit when an operating voltage is lower than a reference voltage.

In exemplary embodiments of the present invention, the pulse generating circuit may include: a discharger operating in response to the pulse signal, and connected between an internal node and a ground voltage; and a pulse generator generating the pulse signal by receiving the clock signal and a signal of the internal node.

In exemplary embodiments of the present invention, the pulse width control circuit may include: a detector detecting whether the operating voltage is lower than the reference voltage; and a pulse chopper connected to the internal node to provide a discharge path in the internal node in response to the detection result of the detector and the pulse signal.

In exemplary embodiments of the present invention, the pulse chopper may provide the discharge path to the internal node in response to the pulse signal when the operating voltage is lower than the reference voltage, thereby reducing a width of the pulse signal.

Exemplary embodiments of the present invention provide a method for controlling a pulsed flip-flop, the method including: generating a pulse signal in response to a clock signal; and reducing a width of the pulse signal when an operating voltage is lower than a reference voltage.

Exemplary embodiments of the present invention provide a pulsed flip-flop including: a flip-flop operating in synchronization with a pulse signal; a discharger operating in a response to the pulse signal and connected between an internal node and a ground voltage; a pulse generator generating the pulse signal by receiving a clock signal and a signal of the internal node; a detection circuit activation a detection signal when an operating voltage is lower than a reference voltage; and a pulse chopper providing a discharge path in the internal node in response to the pulse signal and the detection signal.

In exemplary embodiments of the present invention, the discharger may include: a first transistor having a drain connected to the internal node, a gate connected to receive the pulse signal, and a source; and a second transistor having a drain connected to the source of the first transistor, a gate connected to the operation voltage, and a source that is grounded.

In exemplary embodiments of the present invention, the pulse chopper may include first and second transistors connected in series between the internal node and a ground voltage, the first transistor being controlled by the pulse signal, the second transistor being controlled by the detection signal.

Exemplary embodiments of the present invention provide a pulsed flip-flop that includes: a flip-flop; a pulse generating circuit generating an internal pulse fed to the flip-flop; a detector detecting an operating voltage supplied into the pulse generating circuit; and a pulse chopper controlled by an output signal of the detector to reduce a pulse width of the internal pulse.

In exemplary embodiments of the present invention, the detector may generate a signal enabling the pulse chopper when the operating voltage is lower than a predetermined voltage. The detector may generate a signal disabling the pulse chopper when the operation voltage is higher than a predetermined voltage.

Exemplary embodiments of the present invention provide a pulse generating circuit that may include: a NAND gate having one input terminal connected to a clock signal and another input terminal connected to a first node; a first inverter connected to an output terminal of the NAND gate; a first NMOS transistor having a gate receiving an output of the first inverter and a source connected to the first node; and a second NMOS transistor having a gate receiving the operating voltage, a source connected to the drain of the first NMOS transistor, and a drain connected to a ground voltage.

In exemplary embodiments of the present invention, the pulse chopper may include: a third NMOS transistor having a gate receiving an output of the first inverter, and a source connected to the first node; and a fourth NMOS transistor having a gate receiving an output of the detector, a source connected to the drain of the third NMOS transistor, and a drain connected to a ground voltage.

Exemplary embodiments of the present invention provide a pulse generating circuit that includes: a discharger operating in response to the pulse signal, and connected between an internal node and a ground voltage; and a pulse generator generating the pulse signal by receiving the clock signal and a signal of the internal node.

In exemplary embodiments of the present invention, the detector may generate a signal enabling the pulse chopper when the operation voltage is lower than a predetermined voltage. The detector may generate a signal disabling the pulse chopper when the operating voltage is higher than a predetermined voltage.

BRIEF DESCRIPTION OF THE FIGURES

Exemplary embodiments of the present invention will be understood in more detail from the following descriptions taken in conjunction with the attached drawings. In the figures.

DETAILED DESCRIPTION OF EXEMPLARY EMBODIMENTS

Figure 1:
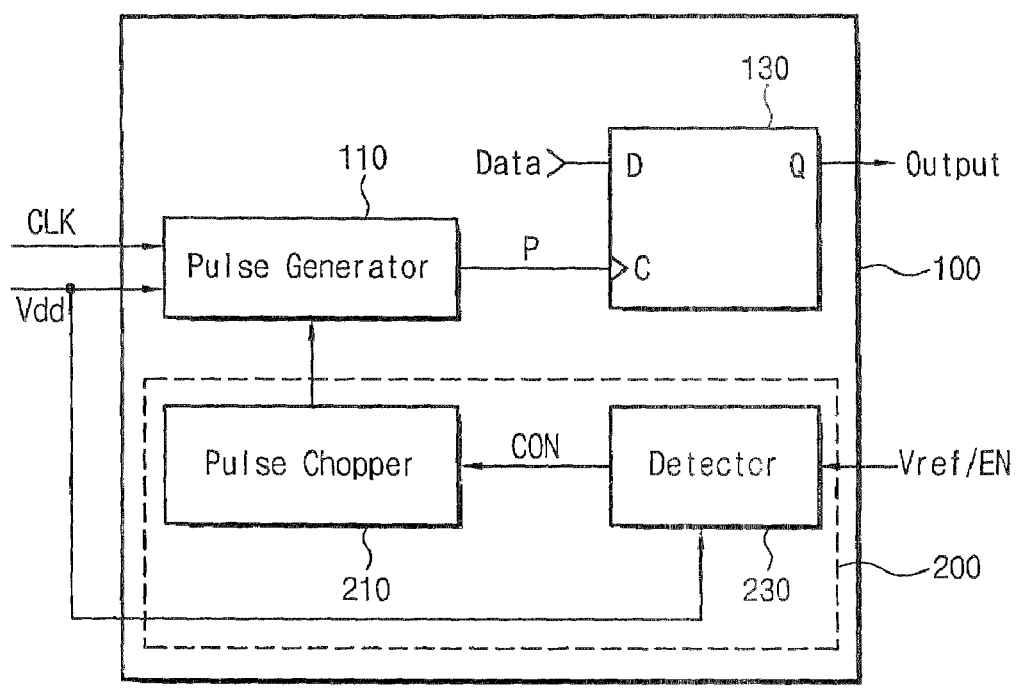
FIG. 1 is a block diagram of a pulsed flip-flop according to an exemplary embodiment of the present invention.

Exemplary embodiments of the present invention will be described below in more detail with reference to the accompanying drawings. The present invention may, however, be embodied in different forms and should not be constructed as limited to the exemplary embodiments set forth herein. Rather, these exemplary embodiments are provided so that this disclosure will be thorough and complete, and will fully convey the scope of the present invention to those skilled in the art. Like reference numerals refer to like elements throughout.

Hereinafter, an exemplary embodiment of the present invention will be described in conjunction with the accompanying drawings.

FIG. 1 is a block diagram of a pulsed flip-flop according to an exemplary embodiment of the present invention. Referring to FIG. 1, the pulsed flip-flop includes a pulse generator 110, a D flip-flop 130 receiving an internal pulse from the pulse generator 110, and a pulse width control circuit 200. A detector 230 whether an operating voltage Vdd fed thereto is below a predetermined level, and controls a pulse chopper 210 according to the detection result. The pulse chopper 210 adjusts a pulse width of an internal pulse, which is generated by the pulse generator 110, under the control of the detector 230.

Figure 2:
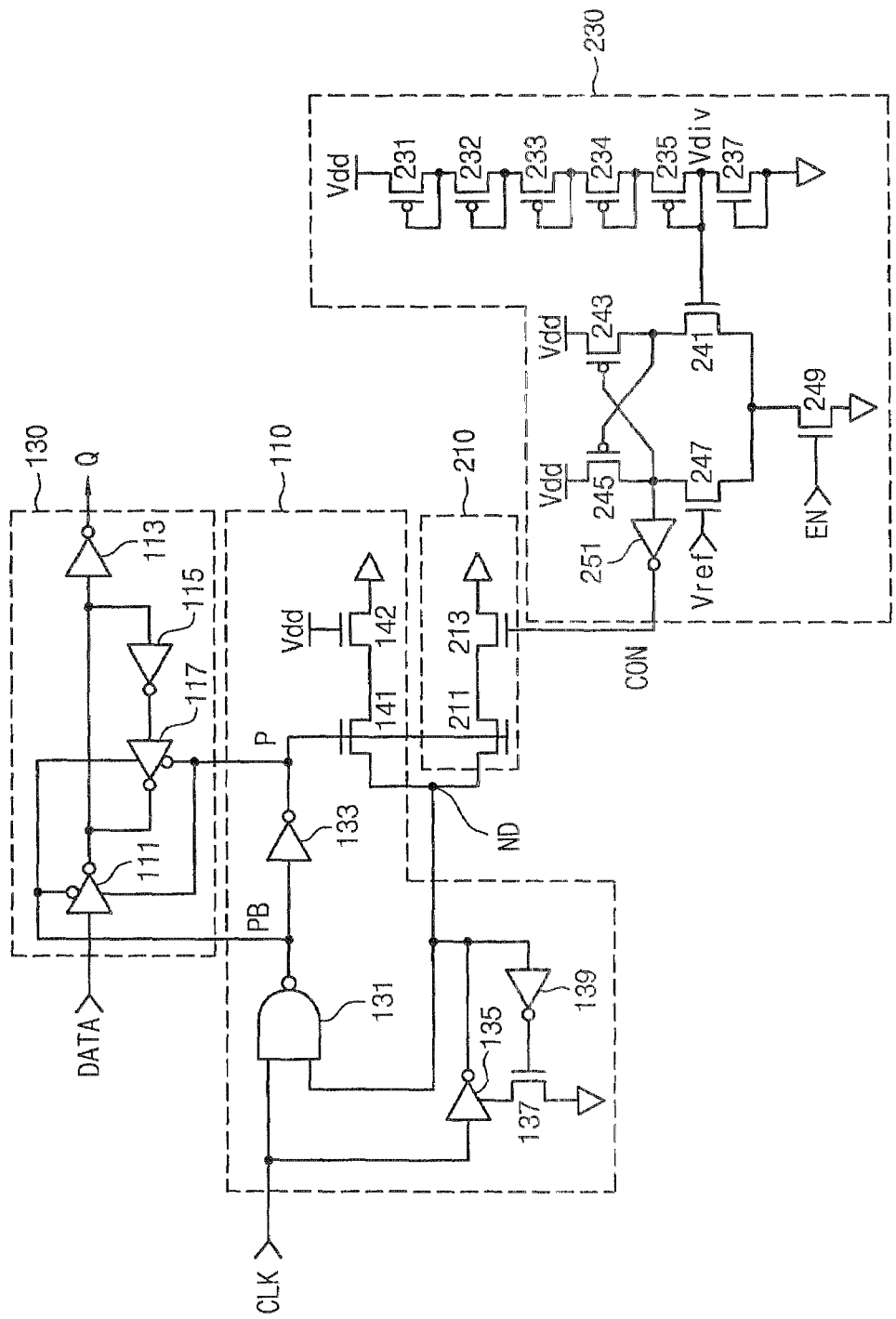
FIG. 2 is a circuit diagram of the pulsed flip-flop of FIG. 1 according to an exemplary embodiment of the present invention.
Figure 3:
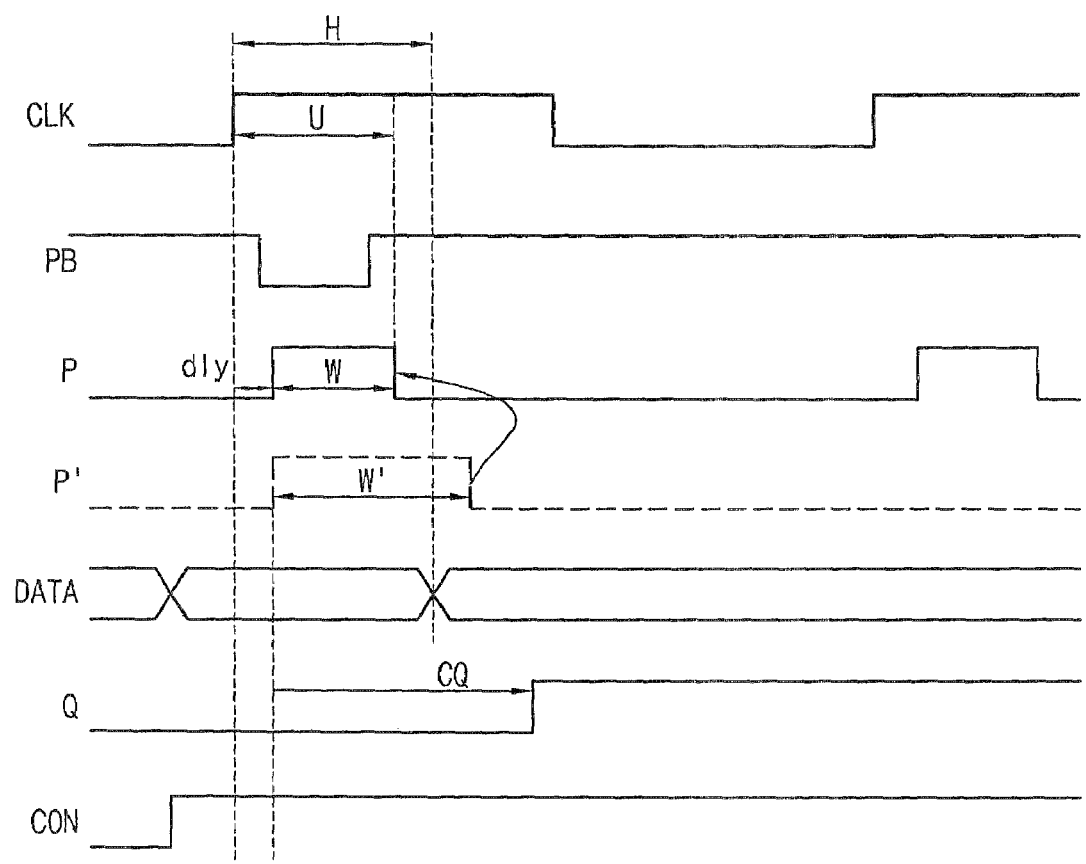
FIG. 3 is a timing diagram of operational characteristics in the pulsed flip-flop of FIGS. 1 and 2 according to an exemplary embodiment of the present invention.

FIG. 2 is a circuit diagram of the pulsed flip-flop of FIG. 1 according to an exemplary embodiment of the present invention. FIG. 3 is a timing diagram of operational characteristics in the pulse flip-flop of FIGS. 1 and 2 according to an exemplary embodiment of the present invention. Referring to FIGS. 2 and 3, the D flip-flop 130 includes two three-phase inverters 111 and 117, and two standard inverters 113 and 115. In the D flip-flop 130, when a pulse signal P inputted from the pulse generator 110 is in a high level, that is, when an inverted pulse PB is in a low level, the three-phase inverter 111 is enabled, and the three-phase inverter 117 is disabled. Then, the D flip-flop 130 outputs input data as an output value Q from the inverter 113. When a pulse P is in a low level, the three-phase inverter 111 is disabled and the three-phase inverter 117 is enabled such that an inputted data is latched.

The pulse generator 110 includes a NAND gate 131, two inverters 133 and 139, a three-phase inverter 135, and two N-channel metal oxide semiconductor (NMOS) transistors 141 and 142. The NMOS transistors 141 and 142 are connected in series between a node ND and a ground voltage, and discharge the node ND in response to a pulse signal P. More specifically, when a gate of the NMOS transistor 142 is connected to a power supply voltage Vdd, and a signal P in a high level is inputted into a gate of the NMOS transistor 141, the NMOS transistor 141 is turned on to make the node ND to be in a low level. The NAND gate 131 performs NAND operation on a clock signal CLK and a voltage level of the node ND for providing an output PB. The inverter 133 inverts the output PB of the NAND gate 131. That is, when the clock signal CLK and the node ND are in a high level, the output PB of the NAND gate 131 is in a low level and, thus, the output P of the inverter 133 is in a high level.

The high level signal P outputted from the inverter 133 is inputted into a gate of the NMOS transistor 141 having a source connected to the node ND. Accordingly, the NMOS transistor 141 is turned on such that a voltage of the node ND becomes in a low level and, because the gate of the NMOS transistor 142 is connected to an internal operating voltage Vdd, the NMOS transistor 142 is turned on. When a voltage of the node ND is in a low level, an output of the NAND gate 131 is in a high level, and an output of the inverter 133 is in a low level. Accordingly, the output of the inverter 113 becomes a pulse signal P having a predetermined pulse width W.

In this exemplary embodiment, when the internal operating voltage Vdd is a voltage of 0.9 V or less, a gate voltage (gate—source voltage) of the NMOS transistor 142 becomes lower. When a gate voltage of the NMOS transistor 142 becomes lower, an amount of current flowing between a source and a drain decrease such that the time point when the node ND becomes in a low level is delayed. That is, a pulse width W of a pulse signal P becomes longer. Referring to FIG. 3, a pulse signal P' is shown in a dotted line. Since the pulsed flip flop 100 of FIG. 1 must maintain data during an interval corresponding to a pulse width W of a pulse signal P, hold time characteristics deteriorate when a pulse width W' becomes wider.

Accordingly, this exemplary embodiment of the present invention includes the pulse width control circuit 200 of FIG. 1 to resolve this problem. The pulse width control circuit 200 includes a pulse chopper 210 and a detector 230. The pulse chopper 210 includes two NMOS transistors 211 and 213 connected in series between the node ND and ground voltage. The pulse signal P is inputted into a gate of the NMOS transistor 211 that has its source connected to the node ND. The output CON of the detector 230 is inputted into a gate of the NMOS transistor 213 that has its source connected to a ground voltage. In this exemplary embodiment, when the output signal CON of the detector 230 and an output signal P of the inverter 133 are in a high level, the NMOS transistors 211 and 213 are turned on such that a voltage of the node ND is in a low level. Accordingly, as described above, an output signal P of the inverter 133 becomes in a low level. In this case, the pulse chopper 210 provides a new discharge path together with the NMOS transistors 141 and 142. That is, since the pulse chopper 210 rapidly discharges voltage of the NMOS transistors 141 and 142 and the node ND into in a low level, the pulse width W of the pulse signal P decreases.

The detector 230 includes a plurality of P-channel metal oxide semiconductor (PMOS) transistors 231 to 235, 243, and 245, NMOS transistors 237, 241, 247, and 249, and an inverter 251. Gates of the PMOS transistors 231 to 235 are connected to respective sources to constitute a diode. The PMOS transistors 231 to 235 and the NMOS transistor 237 constitute a voltage distributor that distributes an internal operating voltage Vdd to output a distribution voltage Vdiv. The PMOS transistors 243 and 245, and the NMOS transistors 241, 247, and 249 constitute a comparator that compares the distribution voltage Vdiv to a reference voltage Vref to output the return value CON. The reference voltage Vref may be set a 0.9 V voltage, and also may be changed if necessary. An enable signal EN is externally supplied to the gate of the NMOS transistor 249 in the detector 230.

When a high-level enable signal EN inputted from the outside, the detector 230 compares the reference voltage Vref to the distribution voltage Vdiv. When the distribution voltage Vdiv is higher than the reference voltage Vref, the detector 230 outputs a low-level signal CON. On the other hand, when the distribution voltage Vdiv is lower than the reference voltage Vref, the detector 230 outputs a high-level signal CON.

As described above, the control signal CON, which is the output of the detector 230, is inputted into a gate of the NMOS transistor 213 in the pulse chopper 210. That is, when the internal operating voltage Vdd is a high voltage, a low-level control signal CON is inputted into a gate of the NMOS transistor 213. Accordingly, the NMOS transistor 213 is turned off such that the pulse chopper is disabled. On the other hand, when the internal operating voltage Vdd is low voltage, a high-level control signal CON is inputted into the gate of the NMOS transistor 213. Accordingly, the pulse chopper 210 is enabled, thereby preventing the pulse width W of the pulse signal P from being increased.

An exemplary embodiment of the present invention provides a pulse width control circuit 200 detecting an internal operating voltage Vdd and adjusting a pulse width of a pulse signal P. That is, detector 230 of the pulse width control circuit 200 detects the level of an internal operating voltage Vdd to generate a control signal CON. The pulse chopper 210 provides a discharge path for the internal node ND in response to the control signal CON. Therefore, the exemplary embodiment of the present invention can prevent a hold time characteristic deterioration that occurs in a pulsed flip-flop during a low voltage.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A pulsed flip-flop comprising:
a flip-flop operating in synchronization with a pulse signal;
a pulse generating circuit generating the pulse signal in response to a clock signal; and
a pulse width control circuit including a pulse chopper connected to an internal node of the pulse generating circuit to provide a discharge path to the internal node for reducing a width of the pulse signal generated by the pulse generating circuit in response to detecting that an operating voltage of the pulsed flip flop is lower than a reference voltage and the pulse signal.

2. The pulsed flip-flop of claim 1, wherein the pulse generating circuit comprises:
a discharger operating in response to the pulse signal, and connected between the internal node of the pulse generating circuit and a ground voltage; and
a pulse generator generating the pulse signal by receiving the clock signal and a signal of the internal node.

3. The pulsed flip-flop of claim 2, wherein the pulse width control circuit comprises:
a detector detecting whether the operation voltage is lower than the reference voltage,
wherein the pulse chopper provides the discharge path to the internal node in response to a detection result of the detector and the pulse signal.

4. The pulsed flip-flop of claim 3, wherein the pulse chopper provides the discharge path to the internal node in response to the pulse signal when the operating voltage is lower than the reference voltage, thereby reducing a width of the pulse signal.

5. A method for controlling a pulsed flip-flop, the method comprising:
generating a pulse signal in response to a clock signal; and
reducing a width of the pulse signal when an operating voltage of the pulsed flip flop is lower than a reference voltage,
wherein the step of reducing a width of the pulse signal includes chopping the width of the pulse signal by providing discharge path to an internal node of a pulse generating circuit used in the step of generating the pulse signal in response to detecting that the operating voltage of the pulsed flip-flop is lower than the reference voltage.

6. A pulsed flip-flop comprising:
a flip-flop operating in synchronization with a pulse signal;
a discharger operating in response to the pulse signal and connected between an internal node and a ground voltage;
a pulse generator generating the pulse signal by receiving a clock signal and a signal of the internal node;
a detection circuit activating a detection signal when an operating of the pulsed flip flop voltage is lower than a reference voltage; and
a pulse chopper providing a discharge path to the internal node in response to the pulse signal and the detection signal.

7. The pulsed flip-flop of claim 6, wherein the discharger comprises:
a first transistor having a drain connected to the internal node, a gate connected to receive the pulse signal, and a source; and
a second transistor having a drain connected to the source of the first transistor, a gate connected to the operating voltage, and a source connected to a ground voltage.

8. The pulsed flip-flop of claim 6, wherein the pulse chopper comprises first and second transistors connected in series between the internal node and a ground voltage, the first transistor being controlled by the pulse signal, the second transistor being controlled by the detection signal.

9. A pulsed flip-flop comprising:
a flip-flop;
a pulse generating circuit generating an internal pulse fed to the flip-flop;
a detector detecting an operating of the pulsed flip flop voltage supplied to the pulse generating circuit; and
a pulse chopper controlled by an output signal of the detector to reduce a pulse width of the internal pulse.

10. The pulsed flip-flop of claim 9, wherein the detector generates a signal enabling the pulse chopper when the operating voltage is lower than a predetermined voltage.

11. The pulsed flip-flop of claim 9, wherein the detector generates a signal disabling the pulse chopper when the operating voltage is higher than a predetermined voltage.

12. The pulsed flip-flop of claim 9, wherein the pulse generating circuit comprises:
- a NAND gate having one input terminal connected to a clock signal and another input terminal connected to a first node;
- a first inverter connected to an output terminal of the NAND gate;
- a first NMOS transistor having a gate receiving an output of the first inverter and a source connected to the first node; and
- a second NMOS transistor having a gate receiving the operating voltage, a source connected to the drain of the first NMOS transistor, and a drain connected to a ground voltage.

13. The pulsed flip-flop of claim 12, wherein the pulse chopper comprises:
- a third NMOS transistor having a gate receiving an output of the first inverter, and a source connected to the first node; and
- a fourth NMOS transistor having a gate receiving an output of the detector, a source connected to the drain of the third NMOS transistor, and a drain connected to a ground voltage.

* * * * *